US006542863B1

(12) United States Patent
Surucu

(10) Patent No.: US 6,542,863 B1
(45) Date of Patent: Apr. 1, 2003

(54) FAST CODEBOOK SEARCH METHOD FOR MPEG AUDIO ENCODING

(75) Inventor: Fahri Surucu, Fremont, CA (US)

(73) Assignee: Intervideo, Inc., Fremont, CA (US)

( * ) Notice: Subject to any disclaimer, the term of this patent is extended or adjusted under 35 U.S.C. 154(b) by 220 days.

(21) Appl. No.: 09/595,389

(22) Filed: Jun. 14, 2000

(51) Int. Cl.[7] .......................... G01L 21/04; G01L 19/00
(52) U.S. Cl. .................. 704/200.1; 704/500; 704/503; 704/229
(58) Field of Search .............................. 704/200, 200.1, 704/500, 501, 502, 503, 504, 226, 227, 229; 548/417; 382/246; 708/270, 290

(56) References Cited

U.S. PATENT DOCUMENTS

| 5,227,788 A | | 7/1993 | Johnston et al. | |
| 5,341,457 A | * | 8/1994 | Hall, II et al. | 702/226 |
| 5,535,300 A | * | 7/1996 | Hall, II et al. | 704/227 |
| 5,559,722 A | | 9/1996 | Nickerson | |
| 5,663,725 A | | 9/1997 | Jang | |
| 5,748,121 A | * | 5/1998 | Romriell | 341/65 |
| 5,848,195 A | * | 12/1998 | Romriell | 382/246 |
| 5,923,376 A | * | 7/1999 | Pullen et al. | 348/417 |
| 5,956,674 A | | 9/1999 | Smyth et al. | |
| 5,974,380 A | | 10/1999 | Smyth et al. | |
| 5,978,762 A | | 11/1999 | Smyth et al. | |
| 6,223,192 B1 | * | 4/2001 | Oberman et al. | 708/270 |
| 6,256,653 B1 | * | 7/2001 | Juffa et al. | 708/290 |
| 6,300,888 B1 | | 10/2001 | Chen et al. | |

OTHER PUBLICATIONS

Moving Pictures Expert Group, "Coding of Moving Pictures and Associated Audio or Digital Storage Media at up to About 1.5 MBIT/s, Part 3 Audio" 3–11171 rev 1.
Moving Pictures Expert Group, "Coding of Moving Pictures and Associated Audio or Digital Storage Media at up to About 1.5 MBIT/s, Part 3 Audio" ISO/IEC 11172–3:1993(E).

* cited by examiner

Primary Examiner—Susan McFadden
(74) Attorney, Agent, or Firm—Reed Smith Crosby Heafey LLP

(57) ABSTRACT

A fast codebook search method for finding an optimal Huffman codebook from a group of Huffman codebooks, wherein the method is especially suited for MPEG-compliant audio encoding. In order to select an optimal codebook from among candidate codebooks for a given sub-region, a bit difference table is created, which for any given data pair contains a bit difference value. The bit difference value is the difference between the number of bits needed for a given data pair (or quadruple) in a first candidate codebook and a second candidate codebook [N bits–M bits]. By summing all such bit difference values for the data samples in a given sub-region, a quick determination can be made as to which codebook would encode the sub-region using the fewest bits (based on the size and/or sign of the sum(s)). For sub-regions having three candidate codebooks, two bit difference sums are calculated. For an implementation of the MPEG-1 Layer III Audio Encoding standard, only 20 bit difference tables are required in order to cover every possible combination of codebook candidates.

19 Claims, 7 Drawing Sheets

First Candidate Codebook — data sample 1 (0 to Nx), data sample 2 (0 to Ny), code length N bits Second Candidate Codebook — data sample 1 (0 to Nx), data sample 2 (0 to Ny), code length M bits Bit Difference Table — data sample 1 (0 to Nx), data sample 2 (0 to Ny), [N-M]

Figure 8

FAST CODEBOOK SEARCH METHOD FOR MPEG AUDIO ENCODING

BACKGROUND OF THE INVENTION

This patent application is related to U.S. patent application Ser. No. 09/595,387 entitled "A FAST CODE LENGTH SEARCH METHOD FOR MPEG AUDIO ENCODING" filed Jun. 14, 2000; and is related to U.S. patent application Ser. No. 09/595,391, entitled "A FAST LOOP ITERATION AND BITSTREAM FORMATTING METHOD FOR MPEG AUDIO ENCODING" filed Jun. 14, 2000; the disclosures of which are herein incorporated by reference.

1. Field of the Invention

The present invention relates generally to the field of audio encoding, and more particularly to a fast codebook search method for finding an optimal Huffman codebook from among a group of Huffman codebooks, wherein the method is especially suited for MPEG-compliant audio encoding.

2. Description of the Related Art

In general, an audio encoder processes a digital audio signal and produces a compressed bit stream suitable for storage. A standard method for audio encoding and decoding is specified by "CODING OF MOVING PICTURES AND ASSOCIATED AUDIO OR DIGITAL STORAGE MEDIA AT UP TO ABOUT 1.5 MBIT/s, Part 3 Audio" (3-11171 rev 1), submitted for approval to ISO-IEC/JTC1 SC29, and prepared by SC29/WG11, also known as MPEG (Moving Pictures Expert Group). This draft version was adopted with some modifications as ISO/IEC 11172-3:1993(E) (hereinafter "MPEG-1 Audio Encoding"). The disclosure of these MPEG-1 Audio Encoding standard specifications are herein incorporated by reference. This standard is also often referred to as "MP3" or "MP3 audio encoding." The exact encoder algorithm is not standardized, and a compliant system may use various means for encoding such as estimation of the auditory masking threshold, quantization, and scaling. However, the encoder output must be such that a decoder conforming to the MPEG-1 standard will produce audio suitable for an intended application.

As shown in FIG. 1, input audio samples are fed into the encoder 2. The mapping stage 4 creates a filtered and sub-sampled representation of the input audio stream. The mapped samples may be called either sub-band samples (as in Layer I, see below) or transformed sub-band samples (as in Layer III). A psychoacoustic model 10 creates a set of data to control the quantizer and coding block 6. The data supplied by the psychoacoustic model 10 may vary depending on the actual coder implementation 6. One possibility is to use an estimation of a masking threshold to do this quantizer control. The quantizer and coding block 6 creates a set of coding symbols from the mapped input samples. Again, the actual implementation of the quantizer and coder block 6 can depend on the encoding system. The frame packing block 8 assembles the actual bit stream from the output data of the other blocks, and adds other information (e.g. error correction) if necessary.

In general, as shown in FIG. 3, each quantized data frame 30 contains 576 data samples. Each frame 30 is divided into three sub-regions 32, 34, 36, with each region containing an even number of data samples, and with at least on region further divided into sub-regions. Adjacent data samples 38, or "data pairs" are used as X, Y coordinates into a Huffman codebook, which provides a single code value for each data pair, as illustrated in FIG. 4. A codebook is a table containing bit codes for encoding the data pairs and a code length value. For certain regions, the data may be encoded in groups of four data samples (quadruples) instead of pairs. The MPEG-1 standard uses 32 different codebooks, of which two or three are candidates for each sub-region, depending on the maximum data value in each sub-region. The "optimal" codebook for each sub-region is the single codebook from among the candidate codebooks that uses the fewest number of total bits to code the entire sub-region.

Depending on the application, different layers of the coding system having increasing encoder complexity and performance can be used. An ISO MPEG Audio Layer N decoder is able to decode bit stream data that has been encoded in Layer N and all layers below N, as described below:

Layer I
This layer contains the basic mapping of the digital audio input into 32 sub-bands, fixed segmentation to format the data into blocks, a psychoacoustic model to determine the adaptive bit allocation, and quantization using block companding and formatting.

Layer II
This layer provides additional coding of bit allocation, scale factors and samples, and a different framing is used.

Layer III
This layer introduces increased frequency resolution based on a hybrid filter bank. It adds a different (non-uniform) quantizer, adaptive segmentation and entropy coding of the quantized values.

Joint stereo coding can be added as an additional feature to any of the layers.

A decoder 12 accepts the compressed audio bit stream, decodes the data elements, and uses the information to produce digital audio output, as shown in FIG. 2. The bit stream data is fed into the decoder 12. Then, the bit stream unpacking and decoding block 14 performs error detection, if error-checking has been applied by the encoder 2. The bit stream data is unpacked to recover the various pieces of information. The reconstruction block 16 reconstructs the quantized version of the set of mapped samples. The inverse mapping block 18 transforms these mapped samples back into uniform PCM (pulse code modulation).

As originally envisioned by the drafters of the MPEG audio encoder specification, the encoder would be implemented in hardware. Hardware implementations provide dedicated processing, but generally have limited available memory. For software MPEG encoding and decoding implementations such as software programs running on Intel Pentium™ class microprocessors, however, the need for greater processing efficiency has arisen, while the memory restrictions are less critical. Specifically, in prior art solutions, the processing time associated with selecting an optimal codebook from among a group of candidate codebooks is much too long.

SUMMARY OF THE INVENTION

The present invention is a fast codebook search method for finding an optimal Huffman codebook from a group of Huffman codebooks, wherein the method is especially suited for MPEG-compliant audio encoding. In order to select an optimal codebook from among candidate codebooks for a given sub-region, a bit difference table is created, which for any given data pair (or quadruple) contains a bit difference value. The bit difference value is the difference between the number of bits needed for a given data pair (or quadruple) in a first candidate codebook and a second candidate codebook [N bits–M bits]. By summing all such bit difference values for the data samples in a given sub-region, a quick determination can be made as to which codebook would encode the sub-region using the fewest bits (based on the size and/or sign of the sum(s)). For sub-regions having three candidate codebooks, two bit difference sums are calculated. For an implementation of the MPEG-1 Layer III Audio Encoding standard, only 20 bit difference tables are required in order to cover every possible combination of codebook candidates.

Thus, the present invention determines the optimal codebook for each sub-region by merely summing the bit difference values from the appropriate bit difference table. This allows for a quicker determination, with much fewer calculations than required by the prior art approach. Since the procedure is performed within an "inner loop" iteration, the present invention reduces the required computation time by about 50% for two codebooks in the group, and approximately 33% if there are three codebooks.

BRIEF DESCRIPTION OF THE DRAWINGS

The present invention will be readily understood by the following detailed description in conjunction with the accompanying drawings, wherein like reference numerals designate like structural elements, and in which:

FIG. 8 is an illustration of a bit difference table constructed according to the present invention.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a fast codebook search method for finding an optimal Huffman codebook from among a group of Huffman codebooks, which is especially suited for MPEG-compliant audio encoding. Any and all such modifications, equivalents and alternatives are intended to fall within the spirit and scope of the present invention.

In standard MPEG-1 Layer III audio encoding, optimal choices of quantization step size and scale factors are obtained by using an iterative technique. In general, a Layer III encoder uses noise allocation. The encoder iteratively varies the quantizers in an orderly way, and quantizes the spectral values. The number of Huffman code bits required to code the audio data are counted, and the resulting noise is determined. If, after quantization, there are still scalefactor bands with more than the allowed distortion (as calculated from the psycho-acoustic model), the encoder amplifies the values in those scalefactor bands and effectively decreases the quantizer step for those bands. The process repeats until either:

1. None of the scalefactor bands have more than the allowed distortion;
2. The next iteration would cause the amplification for any of the bands to exceed the maximum allowed value; or
3. The next iteration would require all the scalefactor bands to be amplified.

Figure 5:
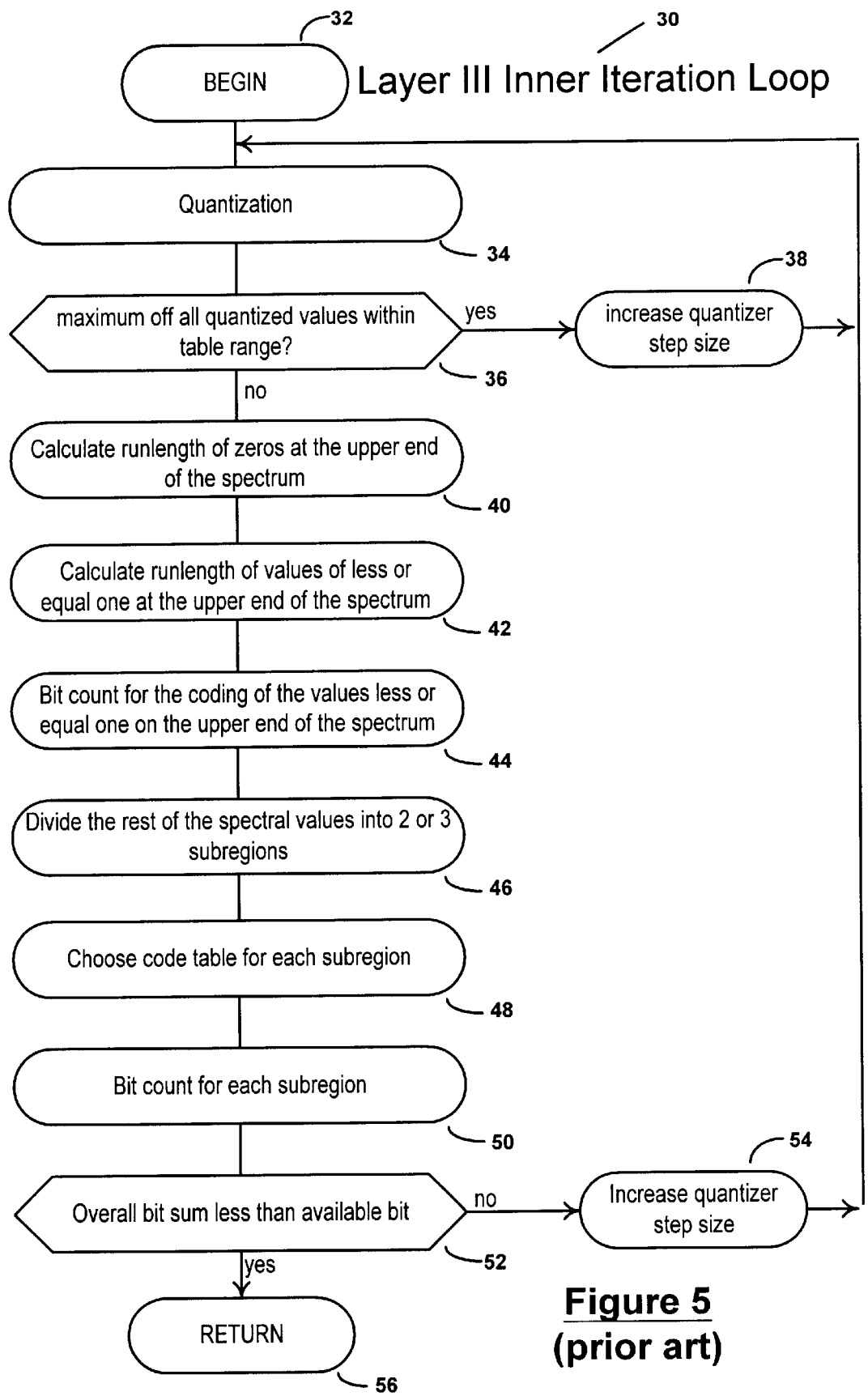
FIG. 5 is a flowchart of the inner iteration loop for ISO MPEG-1 Layer III audio encoding.

The above described procedure is known as the "inner iteration loop" for Layer III encoding. FIG. 5 illustrates a flowchart 30 of the "inner iteration loop" for ISO MPEG-1 Layer III audio encoding, as disclosed in the specification document. In order to appreciate the context of the present invention, the flowchart 30 of FIG. 5 will now be described. The flow begins at step 32 and the data is quantized at step 34. If the maximum of all quantized values is within range, then the quantizer step size is increased at step 38, and then the data is re-quantized at step 34. Otherwise, a runlength of zeros at the upper end of the spectrum is counted at step 40. Ordinarily, the upper end of the spectrum contains a string of zeros, and instead of actually using a codebook, it is more efficient to just count the number of zeros. The zeros are then coded as a "runlength" value (i.e. 20 zeros). Similarly, at the upper end of the spectrum there is usually a string of data samples whose values are less than or equal to one (i.e. −1, 0, or +1). At step 42, the runlength for the number of values less than or equal to one is calculated. The actual coded data includes a sign bit, however, and so at step 44 the number of sign bits needed are calculated and added to the code length, in order to produce a total bit count value. The prior art procedure for this process is illustrated in FIG. 6.

The remaining spectral values are then divided into two or three sub-regions at step 46. For each sub-region there are either two or three candidate codebooks that may be used. The optimal codebook from among the candidate codebooks is selected for each sub-region at step 48, according to the procedure illustrated in FIG. 6. The codelengths for the sub-regions are summed at step 50. Then the total codelength for the entire frame is calculated at step 52 and the size is compared to a limit. If the codelength is too long, the quantizer step size is increased and the procedure repeats back to the quantization step 34, otherwise the loop returns (step 56).

Figure 6:
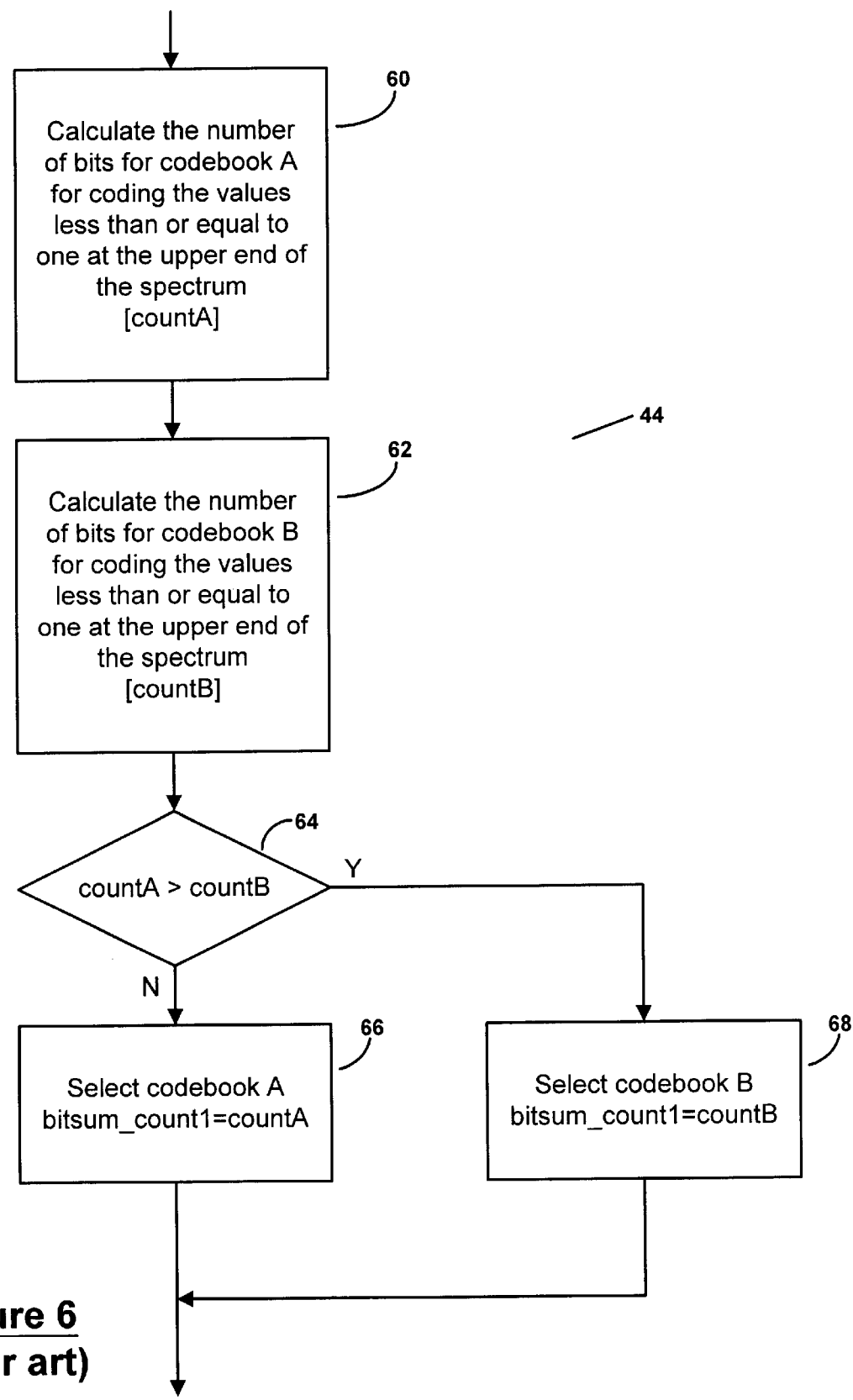
FIG. 6 is a flowchart illustrating the prior art approach to selecting a codebook for the region of values at the upper end of the spectrum that are less than or equal to one.

FIG. 6 illustrates the prior art procedure of step 44 for selecting a codebook for the region of values at the upper end of the spectrum that are less than or equal to one. For this region there are two candidate codebooks—codebook A and codebook B. These data values are coded as "quadruples" (four data values are used as input to the codebooks) as described in the MPEG Audio Encoding standard. The codebook that encodes the data using the fewest total number of bits is selected. First, at step 60, the total number of bits needed to code the values using codebook A are determined. Then, at step 62, the total number of bits needed to code the values using codebook B are determined. The count values are compared at step 64, and codebook A is selected (step 66) if it uses the fewest bits, otherwise codebook B is selected (step 68). Note that this procedure requires a new bit count each time through the iteration loop.

Figure 7:
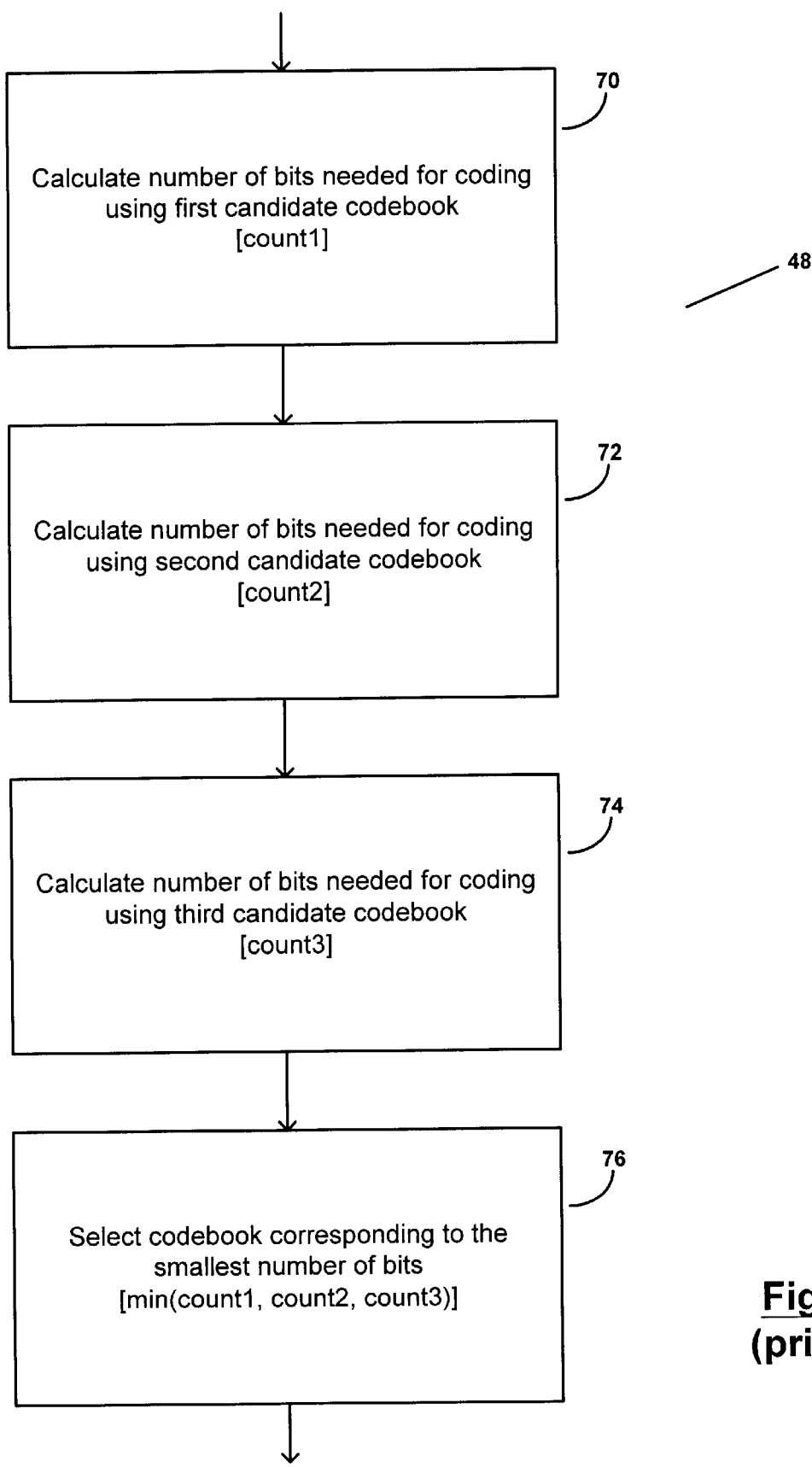
FIG. 7 is a flowchart illustrating the prior art approach to selecting a codebook for each sub-region.

The number of bits used to encode a given sub-region's data samples is minimized by selecting an optimal Huffman codebook during each iteration (step 48). Depending on the maximum magnitude of the data samples in each sub-region (also referred to as sub-band), either two or three Huffman codebooks, out of a total of 32 codebooks, become possible candidates. The procedure for selecting the optimal codebook in step 48 according to the prior art is shown in FIG. 7. First, the total number of bits that each codebook would use for the sub-region is computed. Accordingly, at step 70, the number of bits needed to code the sub-region using the first candidate codebook is calculated. At step 72, the number of bits needed to code the sub-region using the second candidate codebook is calculated. If the sub-region has a third candidate codebook, then the number of bits needed to code the sub-region using the third candidate codebook is calculated at step 74. (As noted above, based on the maximum magnitude of the data samples in each sub-region, either two or three Huffman codebooks are possible candidates). Then, the codebook corresponding to the least number of total bits is selected as the optimal codebook at step 76. However, since this codebook selection process is performed for each iteration (and this inner loop iteration is performed numerous times for each sub-region), the codebook selection requires tremendous processing time.

Thus, according to the prior art, the actual Huffman codes using each candidate Huffman codebook is created for each sub-region, and then the optimal codebook is selected. The present invention reduces the computational cost of finding the best codebook candidate, by reducing the amount of codebook processing time required during each iteration of the inner iteration loop.

Ordinarily, each codebook contains a code and a length value of the code (i.e. the number of bits of the code) for any given pair of data to encode. To choose an optimal codebook between candidate codebooks, the present invention creates a separate codebook-like table, which for any given data pair contains a bit difference value, as illustrated in FIG. 8. The bit difference value is the difference between the number of bits needed for a given data pair in a first candidate codebook and a second candidate codebook [N bits–M bits]. In other words, the bit difference table is created by subtracting the code length values in two candidate codebooks. By summing all such bit difference values for the data samples in a given sub-region, a quick determination can be made as to which codebook would encode the sub-region using the fewest bits (based on the size and/or sign of the sum(s)). According to one embodiment of the present invention, all possible combinations of bit difference tables are created and stored before the encoding procedure is performed. In fact, for an implementation of the MPEG-1 Layer III Audio Encoding standard, only 20 bit difference tables are required in order to cover every possible combination of codebook candidates. While this increases the memory requirements necessary to implement an encoder, the execution performance is greatly enhanced. For software implementations, the extra memory required is generally insignificant, compared to the total memory required to implement the entire encoder.

Figure 9:
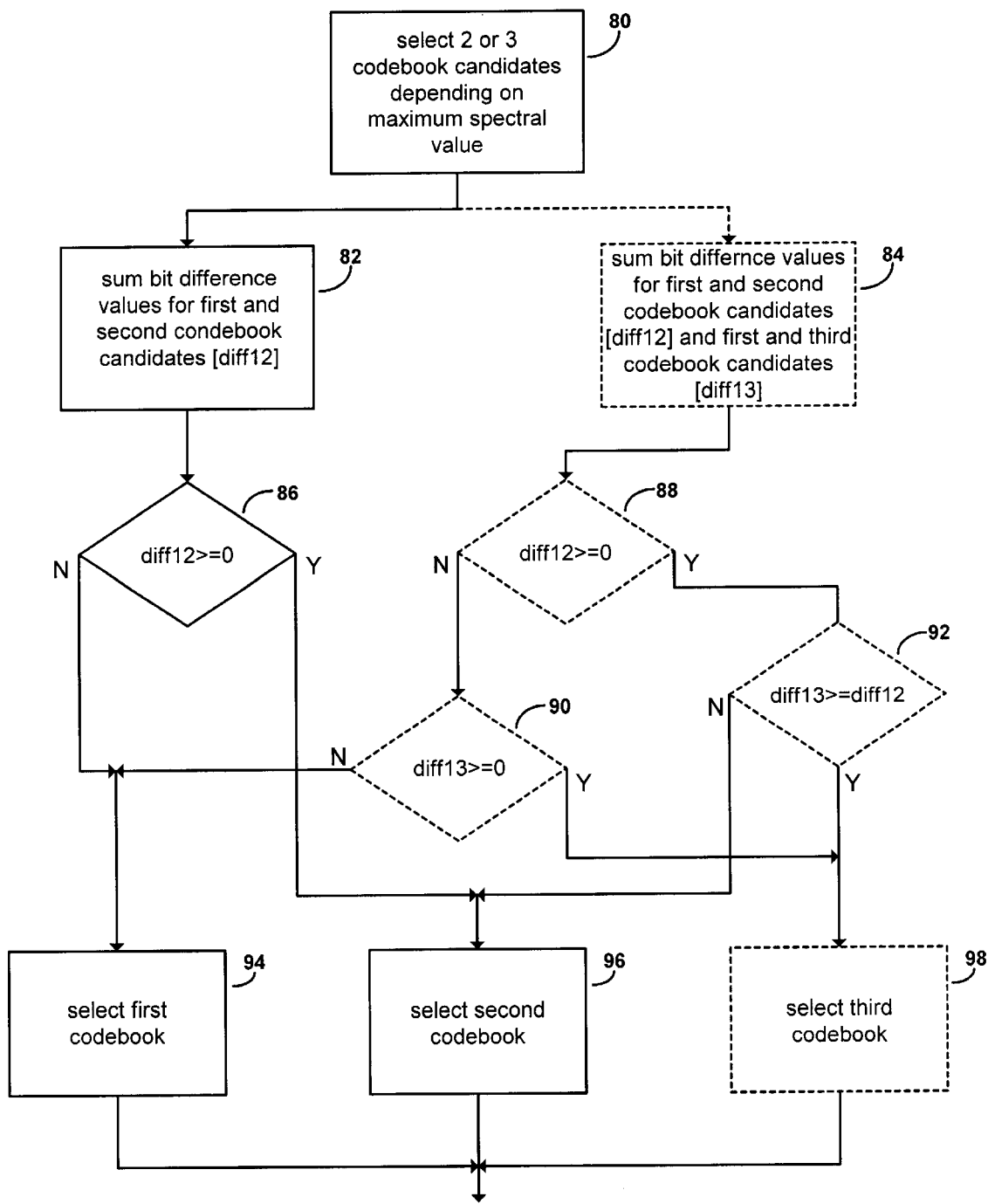
FIG. 9 is a flowchart illustrating a method of selecting a codebook for each sub-region according to the present invention.

One embodiment of the method of the present invention is shown by the flowchart of FIG. 9. First, the appropriate candidate codebooks are selected for the sub-region based on the maximum spectral value (either two or three codebooks are selected at step 80). If two candidate codebooks are selected, a sum of bit difference values for the first and second candidate codebooks is calculated [diff12] from the corresponding bit difference table at step 82. The bit difference value diff12 can be either positive or negative (step 86). If the sum of the bit difference value diff12 is positive (or zero), then the second codebook is chosen (step 96). If the sum of the bit difference values is negative, however, then the first codebook is selected at step 94, since it encodes the data using fewer bits.

If the codebook group contains three codebooks, then two sums are calculated, one for the bit difference values between the first codebook and the second codebook [diff12], and a second sum for the bit difference values between the first codebook and the third codebook [diff13]. If the first sum diff12 is not greater than or equal to zero (step 88), and the second sum diff13 is not greater than or equal to zero (step 90), the first codebook is selected (step 94). If the first sum diff12 is not greater than or equal to zero (step 88), and the second sum diff13 is greater than or equal to zero (step 90), the third codebook is selected (step 98). Similarly, if the first sum diff12 is greater than or equal to zero (step 88), and the second sum diff13 is greater than or equal to the first sum diff12 (step 92), the third codebook is selected. Finally, if the first sum diff12 is greater than or equal to zero (step 88), and the second sum diff13 is not greater than or equal the first sum diff12 (step 92), the second codebook is selected.

In further detail, the present invention utilizes 20 bit difference tables in order to implement MPEG-1 Layer III audio encoding. Consider that for each granule and channel (left, right) there are 576 spectral values to be coded using Huffman codebooks. These spectral regions are initially divided into three regions:

Zeros Region:. The spectral values at the high frequencies tend to have very small values and usually many of them are zero. The "zeros region" (starting from the highest frequency), in which all the spectral values are identical to zero, is not coded at all, but is compressed using runlength compression.

Ones Region: After the "zeros region" toward the low frequencies the spectral values become non-zero and can be at most +/–8191. Before the spectral values get very large, however, there is usually a region of spectral values which are only –1, 0, or 1. This region is called the "ones region" and the values are encoded by either Huffman codebook A or Huffman codebook B. The values are coded as groups of four samples (quadruples), as defined by the MPEG Audio Encoding specification.

Big Values Region: Finally, the rest of the spectral range is called the big values region, which contains at least one spectral value with magnitude larger than one. These values are coded as groups of two (pairs). There are only 29 Huffman codebooks used to encode this region. The Big Values region, depending on the actual audio signal, is divided into either 2 or 3 sub regions and each sub region is encoded with different Huffman codebooks. There are three possible sub region settings (which identify the sub region boundaries in terms of spectral frequency). For each of the sub regions, there are two cases:

1. Maximum absolute value is smaller than 15. In this case, there are 13 different Huffman codebooks available. Further reduction in the number of codebook choices is obtained by checking the maximum absolute spectral value as follows:

7<MaxSpectralValue<15: Candidates are Huffman codebooks 13 and 15.

5<MaxSpectralValue<8: Candidates are Huffman codebooks 10, 11, and 12.

3<MaxSpectralValue<6: Candidates are Huffman codebooks 7, 8, and 9.

2<MaxSpectralValue<4: Candidates are Huffman codebooks 5 and 6.

1<MaxSpectralValue<3: Candidates are Huffman codebooks 2 and 3.

MaxSpectralValue<2: The candidate is Huffman codebook 1.

2. Maximum absolute value is greater than or equal to 15. In this case, there are 16 different Huffman codebooks available. Again the number of codebook choices is reduced by the use of the maximum absolute spectral value. The first eight of these tables use the same codes but differ by the amount of linear bit extension used to represent values larger than 15. Similarly the last eight tables use the same codes and differ only by the linear bit extensions. The number of bits in the extension specifies the maximum spectral value that can be represented. Each of the eight codebooks has a different number of extension bits. Hence, for a given MaxSpectralValue there are two candidate Huffman codebooks (one from each group of 8 tables) as follows:

14<MaxSpectralValue<17: Candidates are Huffman codebooks 16 and 24.

16<MaxSpectralValue<19: Candidates are Huffman codebooks 17 and 24.

18<MaxSpectralValue<23: Candidates are Huffman codebooks 18 and 24.

22<MaxSpectralValue<31: Candidates are Huffman codebooks 19 and 24.

30<MaxSpectralValue<47: Candidates are Huffman codebooks 20 and 25.

46<MaxSpectralValue<79: Candidates are Huffman codebooks 20 and 26.

78<MaxSpectralValue<143: Candidates are Huffman codebooks 21 and 27.

142<MaxSpectralValue<271: Candidates are Huffman codebooks 21 and 28.

270<MaxSpectralValue<527: Candidates are Huffman codebooks 22 and 29.

526<MaxSpectralValue<1039: Candidates are Huffman codebooks 22 and 30.

1038<MaxSpectralValue<2063: Candidates are Huffman codebooks 23 and 30.

2062<MaxSpectralValue<8193: Candidates are Huffman codebooks 23 and 31.

Obviously, there will be a need for seven code bit difference tables for the case in which MaxSpectralValue is less than 15, and 13 more code bit difference tables for the case in which MaxSpectralValue is greater than or equal to 15. The reason that more than 8 code bit difference tables are needed is that the number of bits for extension between the two groups is not identical. The number of extension bits needed for the first group are (1,2,3,4,6,8,10,13) and the number of bits needed for the second group are (4,5,6,7,8, 9,11,13). A total of 20 code bit difference tables are therefore used.

Figure 1:
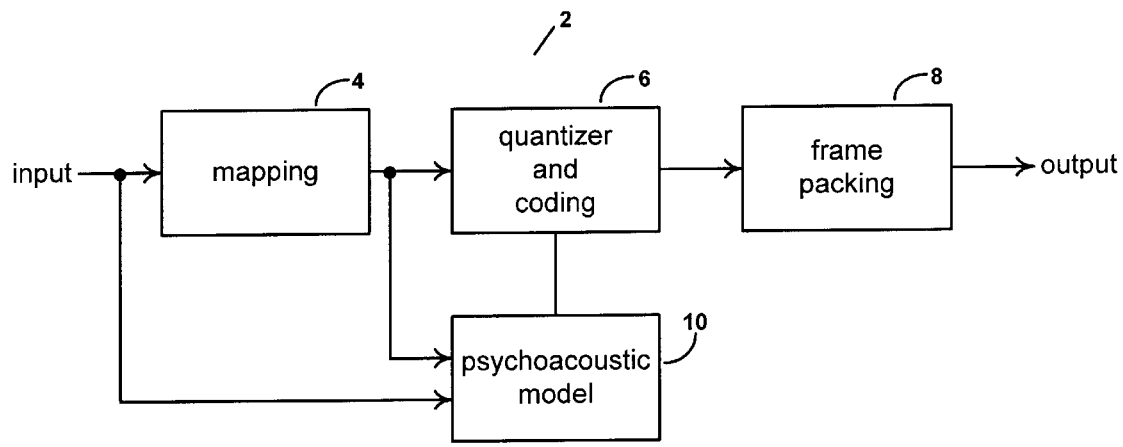
FIG. 1 is a block diagram of an audio encoder.
Figure 2:
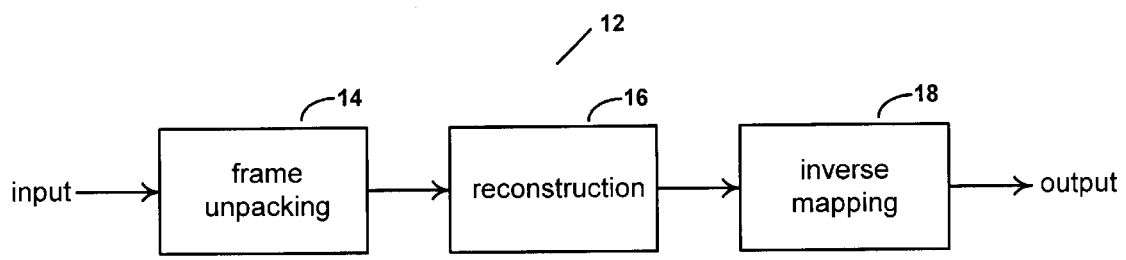
FIG. 2 is a block diagram of an audio decoder.
Figures 3, 4:
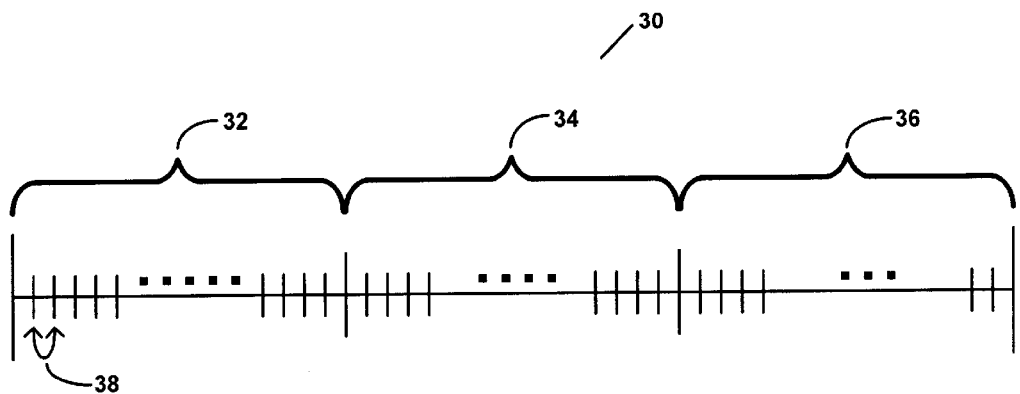
FIG. 3 is a diagram illustrating three sub-regions within a frame.
FIG. 4 is an example of a codebook.

Thus, the present invention determines the optimal codebook for each sub-region by merely summing the bit difference values from the appropriate bit difference table. This allows for a quicker determination, with much fewer calculations than required by the prior art approach. Since the procedure is performed within the "inner loop" iteration, the present invention reduces the required computation time by about 50% for two codebooks in the group, and approximately 33% if there are three codebooks. The only disadvantage of the present method is that additional memory is needed to store the bit difference table(s). The amount of additional memory required, however, is very minimal relative to the total memory requirement of the MPEG-1 Layer III audio encoding. The method of the present invention may be incorporated into the encoder 2 of FIG. 1, specifically the coding block 6, in order to provide a more efficient encoder.

Note that the present invention may advantageously be applied to both steps 44 and 48 of FIG. 5.

Those skilled in the art will appreciate that various adaptations and modifications of the just-described embodiments can be configured without departing from the scope and spirit of the invention. Therefore, it is to be understood that, within the scope of the appended claims, the invention may be practiced other than as specifically described herein.

What is claimed is:

1. A method for selecting a codebook, the method comprising:

creating a first bit difference table, wherein each entry in the table contains a size difference value that is a difference between a first codebook bit length value and a corresponding second codebook bit length value;

summing the size difference values for each data pair or quadruple in a sub-region; and selecting either a first or second codebook based on the summed difference values.

2. The method of claim 1, wherein the first codebook is selected if the sum of the size difference values is negative, and the second codebook is selected if the sum of the size difference values is positive.

3. The method of claim 2, wherein the first bit difference table is created and stored before any data is encoded.

4. The method of claim 3, wherein the method is performed in an MPEG audio encoder implemented in software.

5. The method of claim 1, further comprising:

creating a second bit difference table, wherein each entry in the second bit difference table contains a size difference value that is a difference between a first codebook bit length value and a corresponding third codebook bit length value;

summing the size difference values for each data pair or quadruple in a sub-region for both the first bit difference table and the second bit difference table; and selecting either a first, second or third codebook based on a sign (+/−) and a relative size of the summed difference values.

6. The method of claim 5, wherein the first and second bit difference tables are created and stored before any data is encoded.

7. The method of claim 6, wherein the method is performed in an MPEG audio encoder implemented in software.

8. In an MPEG audio encoder, a method for selecting an optimal Huffman codebook from a set of two codebooks for a sub-sample region, wherein prior to encoding data, a table is created having entries containing a size difference value between a first codebook bit length value and a corresponding second codebook bit length value, the method comprising:

summing the size difference values for each data pair or quadruple in a sub-region; and selecting the first codebook if the sum of the size difference values is negative, and selecting the second codebook if the sum of the size difference values is positive.

9. The method of claim 8, wherein bit difference tables corresponding to every combination of codebook candidate groups are created and stored in memory before encoding data.

10. The method of claim 9, wherein the MPEG audio encoder is implemented in software.

11. In an MPEG audio encoder, a method for selecting an optimal Huffman codebook from a set of three codebooks for a sub-region, wherein prior to encoding data, two tables are created, a first table having entries containing a size difference value between a first codebook bit length value and a corresponding second codebook bit length value, and a second table having entries containing a size difference value between a first codebook length value and a corresponding third codebook length value, the method comprising:

summing the size difference values for each data pair in a sub-region for each table; and selecting a codebook based on a relative size and sign (+/−) of the sums of the difference values for each table.

12. The method of claim 11, wherein bit difference tables corresponding to every combination of codebook candidate groups are created and stored in memory before encoding data.

13. The method of claim 12, wherein the MPEG audio encoder is implemented in software.

14. An MPEG audio encoder comprising:

a table having bit difference value entries, wherein each bit difference value is a difference between the bit length of a first codebook bit length value and a corresponding second codebook bit length value;

wherein the bit difference values are summed for each data pair or quadruple in a sub-region and the first codebook is selected if the sum of the difference values is negative, and the second codebook is selected if the sum of the difference values is positive.

15. The MPEG audio encoder of claim 14, further comprising:

a plurality of bit difference tables corresponding to every possible combination of codebook candidate groups.

16. The MPEG audio encoder of claim 15, wherein the MPEG audio encoder is implemented in software.

17. An MPEG audio encoder comprising:

a first table having bit difference value entries, wherein each bit difference value is a difference between the bit length of a first codebook bit length value and a corresponding second codebook bit length value;

a second table having bit difference value entries, wherein each bit difference value is a difference between the bit length of a first codebook bit length value and a corresponding third codebook bit length value;

wherein the bit difference values are summed for each data pair in a sub-region for both tables, and an optimal codebook is selected based on a relative size and sign (+/−) of the bit difference sums.

18. The MPEG audio encoder of claim 17, wherein the MPEG audio encoder is implemented in software.

19. A method for selecting an optimal codebook in an MPEG audio encoding process, the method comprising:

creating a plurality of bit difference tables corresponding to every combination of codebook candidate groups, wherein each entry in a table contains a size difference value that is a difference between a first codebook bit length value and a corresponding second codebook bit length value;

storing the bit difference tables in memory before encoding data;

summing the size difference values for each data pair or quadruple in a sub-region using a corresponding bit difference table stored in memory, during a data encoding process; and selecting a candidate codebook based on the summed difference values.

* * * * *

UNITED STATES PATENT AND TRADEMARK OFFICE
CERTIFICATE OF CORRECTION

PATENT NO.    : 6,542,863 B1
DATED         : April 1, 2003
INVENTOR(S)   : Fahri Surucu It is certified that error appears in the above-identified patent and that said Letters Patent is hereby corrected as shown below:

<u>Column 10,</u>
Line 33, insert claims 20 and 21:

20. A computer readable medium including computer code for selecting a codebook, the computer readable medium comprising:
    computer code including a first bit difference table, wherein each entry in the table contains a size difference value that is a difference between a first codebook length value and a corresponding second codebook length value;
    computer code for summing the size difference values for each data pair or quadruple in a sub-region; and
  computer code for selecting either a first or second codebook based on the summed difference values.

21. A computer readable medium including computer code for selecting an optimal codebook in an MPEG audio encoding process, the computer readable medium comprising:
    computer code including a plurality of bit difference tables corresponding to every combination of codebook candidate groups, wherein each entry in a table contains a size difference value that is a difference between a first codebook bit length value and a corresponding second codebook bit length value;
    computer code for storing the bit difference tables in memory before encoding data;
    computer code for summing the size difference value for each data pair or quadruple in a sub-region using a corresponding bit difference table stored in memory during a data encoding process; and
    computer code for selecting a candidate codebook based on the summed difference values.

Signed and Sealed this

Fifth Day of August, 2003

JAMES E. ROGAN
*Director of the United States Patent and Trademark Office*